(12) United States Patent
Wolff

(10) Patent No.: US 9,739,836 B2
(45) Date of Patent: Aug. 22, 2017

(54) BATTERY MANAGEMENT SYSTEM HAVING A DATA INTERFACE FOR A BATTERY MODULE, BATTERY MODULE HAVING A DATA MEMORY, BATTERY SYSTEM HAVING A BATTERY MANAGEMENT SYSTEM AND A BATTERY MODULE, AND MOTOR VEHICLE HAVING A BATTERY SYSTEM

(71) Applicants: Robert Bosch GmbH, Stuttgart (DE); Samsung SDI Co., Ltd, Yongin-si, Gyeonggi-do (KR)

(72) Inventor: Hans-Joerg Wolff, Schorndorf (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 817 days.

(21) Appl. No.: 13/960,850

(22) Filed: Aug. 7, 2013

(65) Prior Publication Data
US 2014/0042827 A1 Feb. 13, 2014

(30) Foreign Application Priority Data
Aug. 8, 2012 (DE) ......................... 10 2012 214 091

(51) Int. Cl.
| | |
|---|---|
| *G01R 31/36* | (2006.01) |
| *H01M 10/48* | (2006.01) |
| *H01M 10/42* | (2006.01) |
| *H04Q 9/00* | (2006.01) |

(52) U.S. Cl.
CPC ...... *G01R 31/3644* (2013.01); *H01M 10/425* (2013.01); *H01M 10/48* (2013.01); *H04Q 9/00* (2013.01); *H01M 2010/4271* (2013.01); *H01M 2010/4278* (2013.01); *Y10T 307/826* (2015.04)

(58) Field of Classification Search
None
See application file for complete search history.

(56) References Cited

U.S. PATENT DOCUMENTS 5,717,306 A * 2/1998 Shipp ..................... H01M 10/48
307/125
8,564,245 B2 * 10/2013 Bosch ...................... B60L 3/04
320/116

(Continued)

FOREIGN PATENT DOCUMENTS

| CN | 101312260 A | 11/2008 |
|---|---|---|
| CN | 101764417 A | 6/2010 |

(Continued)

*Primary Examiner* — Rexford Barnie
*Assistant Examiner* — David Shiao
(74) *Attorney, Agent, or Firm* — Maginot, Moore & Beck LLP

(57) ABSTRACT

The disclosure describes a battery management system, a battery module, a battery system and a motor vehicle. In order to be able to reliably exchange battery modules, the battery module is provided with a data memory, and the battery management system is provided with a control apparatus, which can be connected to the data memory so as to transmit data, and with a bridging switch, wherein the control apparatus closes the bridging switch on the basis of the data in the data memory and therefore bridges the battery module.

6 Claims, 3 Drawing Sheets

(56) References Cited

U.S. PATENT DOCUMENTS

| | | | | |
|---|---|---|---|---|
| 2010/0194339 A1* | 8/2010 | Yang | .................... | H02J 7/0016 320/116 |
| 2011/0078470 A1* | 3/2011 | Wang | ....................... | G06F 1/28 713/320 |
| 2012/0116699 A1* | 5/2012 | Haag | .................... | B60L 3/0046 702/63 |
| 2012/0139491 A1* | 6/2012 | Eberhard | .............. | H02J 7/0016 320/118 |
| 2013/0002016 A1* | 1/2013 | Furukawa | ........... | H01M 10/425 307/9.1 |
| 2013/0033102 A1* | 2/2013 | Goff | .................... | H02J 7/0014 307/10.6 |

FOREIGN PATENT DOCUMENTS

| | | | | |
|---|---|---|---|---|
| CN | 102136743 A | 7/2011 | | |
| CN | 202210687 U | 5/2012 | | |
| CN | 202260493 U | 5/2012 | | |
| DE | WO 2010089001 A1 * | 8/2010 | ................ | B60L 3/04 |
| JP | WO 2012053426 A1 * | 4/2012 | .......... | H01M 10/425 |

* cited by examiner

BATTERY MANAGEMENT SYSTEM HAVING A DATA INTERFACE FOR A BATTERY MODULE, BATTERY MODULE HAVING A DATA MEMORY, BATTERY SYSTEM HAVING A BATTERY MANAGEMENT SYSTEM AND A BATTERY MODULE, AND MOTOR VEHICLE HAVING A BATTERY SYSTEM

This application claims priority under 35 U.S.C. §119 to patent application no. DE 10 2012 214 091.3, filed on Aug. 8, 2012 in Germany, the disclosure of which is incorporated herein by reference in its entirety.

The present disclosure relates to a battery management system for a battery having at least one battery module, wherein the battery management system has at least one bridging switch for bridging the at least one battery module, and a control apparatus for controlling the bridging switch. The present disclosure also relates to a battery module for a battery, having at least one battery cell. The disclosure further relates to a battery system having a battery which has at least one battery module and having a battery management system having a bridging switch which bridges the battery module as required. The present disclosure finally relates to a motor vehicle having a battery system, wherein the battery system is connected to a drive system of the motor vehicle.

BACKGROUND

Battery management systems and battery modules and also battery systems and motor vehicles of the type cited in the introductory part are generally known. Battery management systems are used, for example, for monitoring and controlling individual battery cells or battery modules of a battery. The batteries can provide, for example, drive energy for motor vehicles which can be at least partially or completely electrically driven or operating energy for stationary installations, for example in wind power installations. It is also known to provide the battery management system with bridging switches in order to bridge individual battery modules and therefore to vary an output voltage of the battery or to disconnect defective battery modules from functioning battery modules.

However, if defective battery modules are to be exchanged for functioning battery modules, this requires detailed technical knowledge about the manner of operation of the battery modules and of the battery management system. Particularly when a module is to be exchanged for a module of a new design, specifically disturbances in the operation of the battery can occur if the battery module of a new design is not compatible with the previous battery modules or the battery system. However, it may be necessary to use other types of battery modules if the previously used design is, for example, no longer available or if battery modules with improved battery technology are to be used.

SUMMARY

The disclosure provides a battery management system of the type cited in the introductory part which has a data interface for coupling a data memory of the battery module to the control apparatus, wherein the bridging switch can be closed by the control apparatus in dependence on data which is provided by the data interface. The disclosure also provides a battery module of the type cited in the introductory part which has a non-volatile data memory in which production and/or operating data of the battery module is stored, wherein the battery module is equipped with a data interface for coupling the data memory to a battery management system. The disclosure further provides a battery system of the type cited in the introductory part, wherein the battery module and the battery management system of the battery system are designed according to the disclosure. The disclosure finally provides a motor vehicle of the type cited in the introductory part, the battery system of said motor vehicle, which battery system is connected to the drive system of said motor vehicle, being designed according to the disclosure.

If one battery module is now exchanged for another battery module, the battery management system can identify on the basis of the data stored in the other battery module whether the other battery module is compatible with the battery modules which are already used in the battery. If the other battery module is not compatible, it can be bridged by the bridging switch and therefore a malfunction of the battery system can be prevented. In the case of a new module with, for example, relatively high power data, the battery management system can preferably connect the module when power is provided.

If the other battery module is a used battery module with previous operating data of the battery module being stored in the data memory of said used battery module, the battery management system can decide on the basis of the operating data whether the battery module, for example on account of its age, should still be used with the existing battery modules. If the battery module is too old or already too severely depleted, the battery management system can fully or partially bridge the battery module during operation.

The battery management system can be further improved by various refinements which are each inherently advantageous and can be combined with one another in any desired manner. These refinement embodiments and the advantages associated with them will be discussed in the text which follows.

According to a first embodiment, the data interface can be designed to couple data memories of a plurality of battery modules to the control apparatus. If the battery has a plurality of battery modules, each of the battery modules can, in particular, be provided with a data memory, wherein the data in each of the data memories can be passed to the control apparatus via the data interface of the respective battery module.

The battery management system can also have a plurality of bridging switches which, so as to transmit a control signal, are connected to the control apparatus so as to transmit a control signal. In particular, the battery management system can have one bridging switch for each battery module of the battery, and the control apparatus can be connected to each of the bridging switches so as to transmit a control signal.

According to a further advantageous refinement, the battery management system can have a sensor device having at least one sensor which detects an operating parameter of the battery module, wherein the sensor device can be connected to the data interface and/or to the control apparatus so as to transmit data. The detected operating parameters can be passed to the data memory of the battery module as data either via the control device or directly via the data interface, with the result that a history of the operating parameters of the battery module can be stored in the data memory of said battery module. As an alternative or in addition, the operating data can also be stored in a data memory which is provided in the battery management system. Furthermore, the operating data can be used in the control apparatus in order to bridge the corresponding battery module by closing the bridging switch or to partially bridge the corresponding battery module during operation on account of the operating data in the event of impermissible operating data in the battery module.

In order to be able to exchange one of the battery modules, the data interface can be designed such that it can be repeatedly disconnected from the battery module and can be repeatedly connected to the battery module. For example, the data interface of the battery management system can have a plug, and the data interface of the battery module can have a mating plug, wherein the plug and the mating plug, when they are in a connected state, connect the battery module and the battery management system to one another so as to transmit data. The bridging switch can also be designed such that it can be repeatedly disconnected from the battery module and repeatedly connected to the battery module in order to be able to exchange the battery module.

As an alternative, the bridging switch can be arranged in the battery and a control line which connects the bridging switch to the control apparatus so as to transmit a control signal can be designed such that it can be repeatedly disconnected from the bridging switch and can be repeatedly connected to the bridging switch. Plug connections can be used for the connections which can be repeatedly disconnected or connected.

As an alternative or in addition to the sensor device of the battery management system, the battery module or the battery can have a sensor device having at least one sensor which detects an operating parameter of the battery module, wherein the sensor device is connected to the data memory of the battery module and/or to the data interface of said battery module so as to transmit data. Therefore, the operating parameters, which are provided as data, can be stored in the data memory of the battery module and/or can be output to the control apparatus via the data memory or directly via the data interface.

The battery module and the battery management system can together be part of a battery system, wherein the battery module and the battery management system are designed in order to be able to repeatedly exchange the battery module for another battery module. By way of example, electrical connections between the battery module and the battery management system can be designed as plug connections. In addition, mechanical connections between the battery module and the battery management system can be formed such that they can be repeatedly disconnected.

In order to prevent incompatible battery modules being operated with the battery management system, the battery management system can be designed to automatically bridge battery modules which are connected to the battery management system but are not compatible with the battery system, that is to say for example with other battery modules of the battery system. In the case of one of the battery modules being bridged, the battery management system can output a signal which represents this bridging state for the purpose of providing information to a user or an operator of the battery system.

The battery module can have at least one battery cell using lithium technology and preferably at least one lithium-ion battery cell, and the battery management system can be designed to monitor and/or control battery cells of this kind.

BRIEF DESCRIPTION OF THE DRAWINGS

The disclosure will be explained below by way of example on the basis of exemplary embodiments with reference to the drawings. The distinguishing features of the exemplary embodiments can be combined independently of one another, as has already been demonstrated in the individual advantageous refinements. In the drawings.

DETAILED DESCRIPTION

The design and function of a battery management system according to the disclosure are first described with reference to the exemplary embodiment of FIG. 1.

Figure 1:
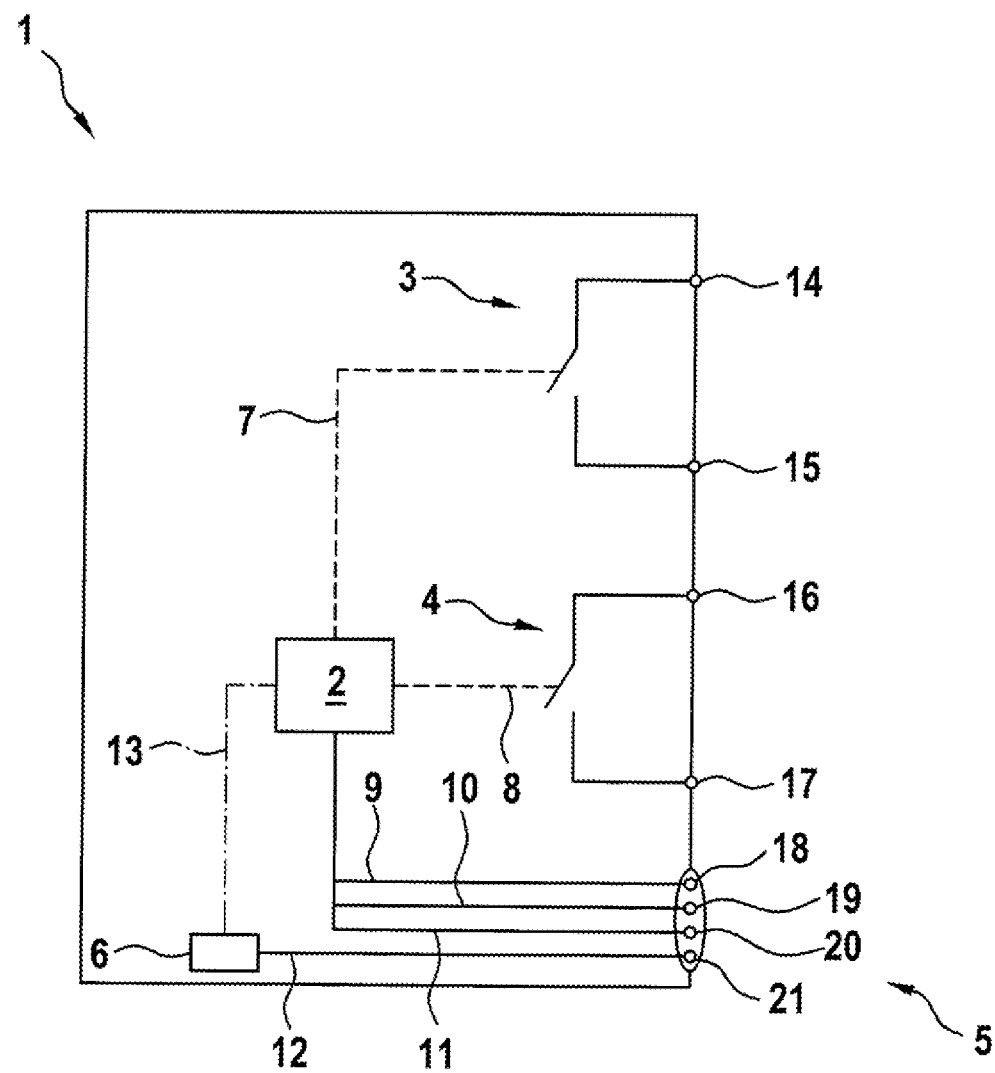
FIG. 1 shows a schematic illustration of an exemplary embodiment of the battery management system according to the disclosure.

FIG. 1 shows the battery management system 1 having a control apparatus 2 and two bridging switches 3, 4. The battery management system 1 is also illustrated in a manner equipped with a data interface 5 and a sensor device 6.

The control apparatus 2 is connected to one of the bridging switches 3, 4 via in each case one control line 7, 8 so as to transmit a control signal, wherein the bridging switches 3, 4 open or close or are opened or closed in dependence on the control signal. The bridging switches 3, 4 can be in the form of semiconductor switches and switch electrical currents of up to 60 amperes or more and electrical voltages of several hundred volts.

The control apparatus 2 is also connected to the data interface 5 via data lines 9, 10, 11 so as to transmit data. The sensor device 6 is connected directly to the data interface 5 via a data line 12 or to the control apparatus 2 via a data line 13 and, alternatively, to the data interface 5 via one of the data lines 9, 10, 11 so as to transmit data.

In a closed, that is to say conductive, state of the bridging switches 3, 4, the bridging switch 3 connects two connection elements 14, 15 to one another, and the bridging switch 4 connects two connection elements 16, 17 for battery modules to one another. The connection elements 14, 15, 16, 17 can each be in the form of plug elements which can be repeatedly connected to a mating plug and which can preferably conduct high currents of 50 or more amperes at up to 600 volts or more.

Connection elements 18, 19, 20, 21 of the data interface 5 can likewise be in the form of plugs or in the form of plug contacts of a plug which can be repeatedly connected to a mating plug or to mating plug contacts and can conduct data, for example digital data.

The battery management system 1 can have a different number of bridging switches 3, 4 and, for example, one or else three, four or up to ten or 20 or more bridging switches 3, 4. In particular, the number of bridging switches 3, 4 of the battery management system 1 can correspond to the number of battery modules which are intended to be connected to the battery management system 1. The battery management system 1 can also have more than one data interface 5 and/or the data interface 5 can have more or fewer than the four shown connection elements 18, 19, 20, 21 for data transmission. The number of data interfaces 5 or connection elements 18, 19, 20, 21 can correspond to the number of battery modules which are intended to communicate with the battery management system 1 so as to interchange data in this case too.

Figure 2:
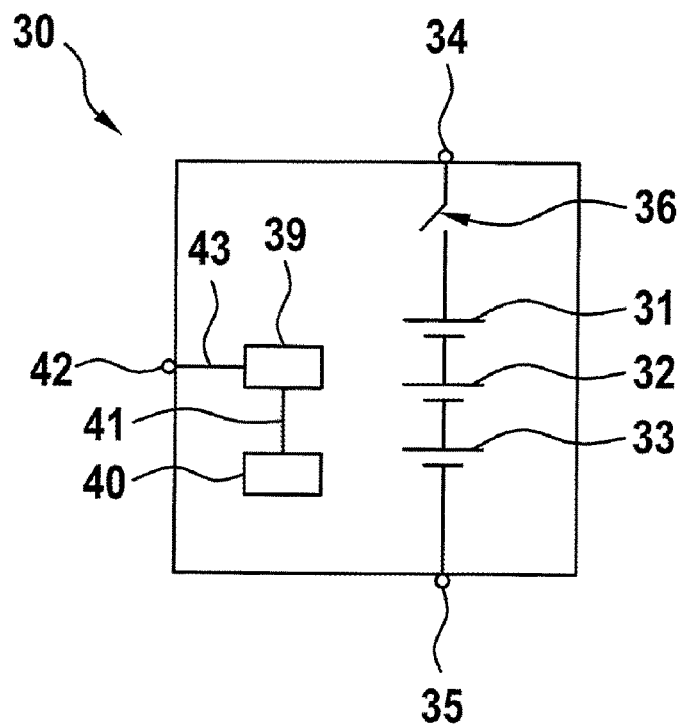
FIG. 2 shows a schematic illustration of an exemplary embodiment of a battery module according to the disclosure.

FIG. 2 shows a further exemplary embodiment, wherein the same reference symbols are used for elements which correspond to the elements of the exemplary embodiment of previous FIG. 1 in respect of function and/or design. For the sake of brevity, only the differences from the exemplary embodiment of the previous figure will be discussed.

FIG. 2 shows a battery module 30 according to the disclosure by way of example having three battery cells 31, 32, 33. According to the exemplary embodiment of FIG. 2, the three battery cells 31, 32, 33 are connected in series with one another. It goes without saying that the battery module 30 can also have more or fewer than three battery cells 31, 32, 33 depending on the required battery power, wherein the battery cells 31, 32, 33 can selectively all be connected in series and/or parallel with one another or else selected battery cells 31, 32, 33 can be connected in series and/or parallel with one another. Connection elements 34, 35 of the battery module 30 are shown connected in series with the battery cells 31, 32, 33 and are designed to connect the battery module 30 to further battery modules 30, to consumers or sources of electrical energy and/or in each case to one of the connection elements 14, 15, 16, 17 of one of the bridging switches 3, 4.

The switch 36 can be used to interrupt the electrical connection of the battery cells 31, 32, 33 to one of the connection elements 34, 35 and, in particular, to the connection element 34, with the result that electrical energy can no longer from or to the battery cells 31, 32, 33 through the connection elements 34, 35. The switch 36 can also be in the form of a semiconductor switch. As an alternative to the arrangement of the switch 36 in the battery module 30, the switch 36 can also be arranged outside the battery module 30 and, for example, in the battery management system 1 or in a battery which comprises the battery module 30.

The battery module 30 is provided with a data memory 39 which can be in the form of a non-volatile data memory, for example in the form of an EEPROM, which can be written to. Production or manufacturing data of the battery module 30 or other specification data of the battery module 30 is stored in the data memory 39. Furthermore, operating data of the battery module 30 can be stored in the data memory 39. The operating data can comprise the number of charging or discharging cycles which have been carried out to date, particular operating states or other operating data of the battery module 30. Furthermore, measurement data of the battery module 30 can be stored in the data memory 39. The measurement data can comprise, for example, temperatures or temperature profiles or electrical loadings or loading profiles of the battery module 30. In order to detect the measurement data, the battery module 30 can be designed with a sensor device 40 which can be connected to the data memory 39 via a sensor or data line 41 so as to transmit sensor data.

In order to be able to output the data of the data memory 39 to the battery management system 1, the battery module 30 is provided with a data interface 42 which is connected to the data memory 39 via a data line 43 so as to transmit data. The data interface 42 can be designed such that it can be repeatedly connected to the data interface 5 of the battery management system 1 and can be repeatedly disconnected from said data interface. For example, the data interface 42 is in the form of a mating plug of the data interface 5 which is in the form of a plug, wherein the plug and the mating plug are designed such that they can be repeatedly plug-connected and disconnected.

Figure 3:
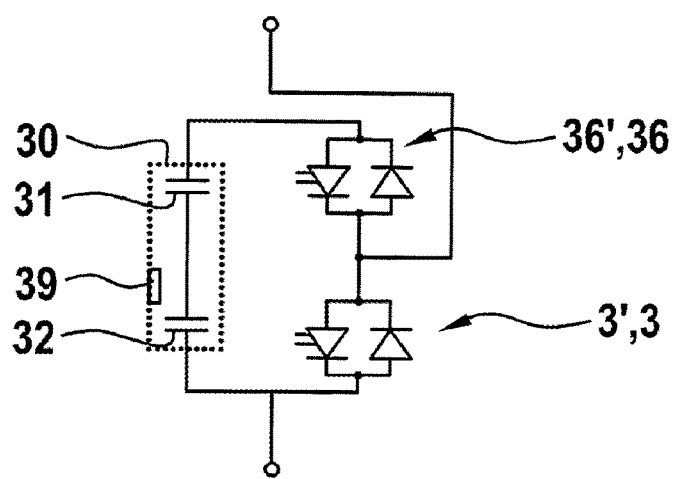
FIG. 3 shows a schematic illustration of a further exemplary embodiment of the battery module according to the disclosure.

FIG. 3 shows a further exemplary embodiment, wherein the same reference symbols are used for elements which correspond to the elements of the exemplary embodiments of previous FIGS. 1 and 2 in respect of function and/or design. For the sake of brevity, only the differences from the exemplary embodiments of the previous figures will be discussed.

FIG. 3 shows a variant of the battery module 30 of FIG. 2. In FIG. 3, the battery module 30 is illustrated, by way of example, with only two battery cells 31, 32. It goes without saying that the battery module 30 can also have more than two battery cells 31, 32 which can be connected in parallel or in series with one another depending on requirements.

One of the bridging switches 3, 4, and for example the bridging switch 3, is shown as a semiconductor switching element 3'. The switch 36 is also shown as a semiconductor switching element 36' of this kind. In this case, the semiconductor switching elements 3', 36' are designed and connected to the battery cells 31, 32 such that they can conduct the electrical current through the battery cells 31, 32 or past said battery cells. For example, the semiconductor switching elements 3', 36' are connected in parallel with a half-bridge circuit and can be connected to the control apparatus 2 so as to transmit a control signal.

At least the bridging switch 3 can be connected to the control apparatus 2 via the control line 7 so as to transmit control data, even if the bridging switch 3 is not part of the battery management system 1 but rather of the battery. The bridging switch 3 and/or the switch 36 can be part of the battery management system 1 or of the battery which comprises the battery module 30.

Figure 4:
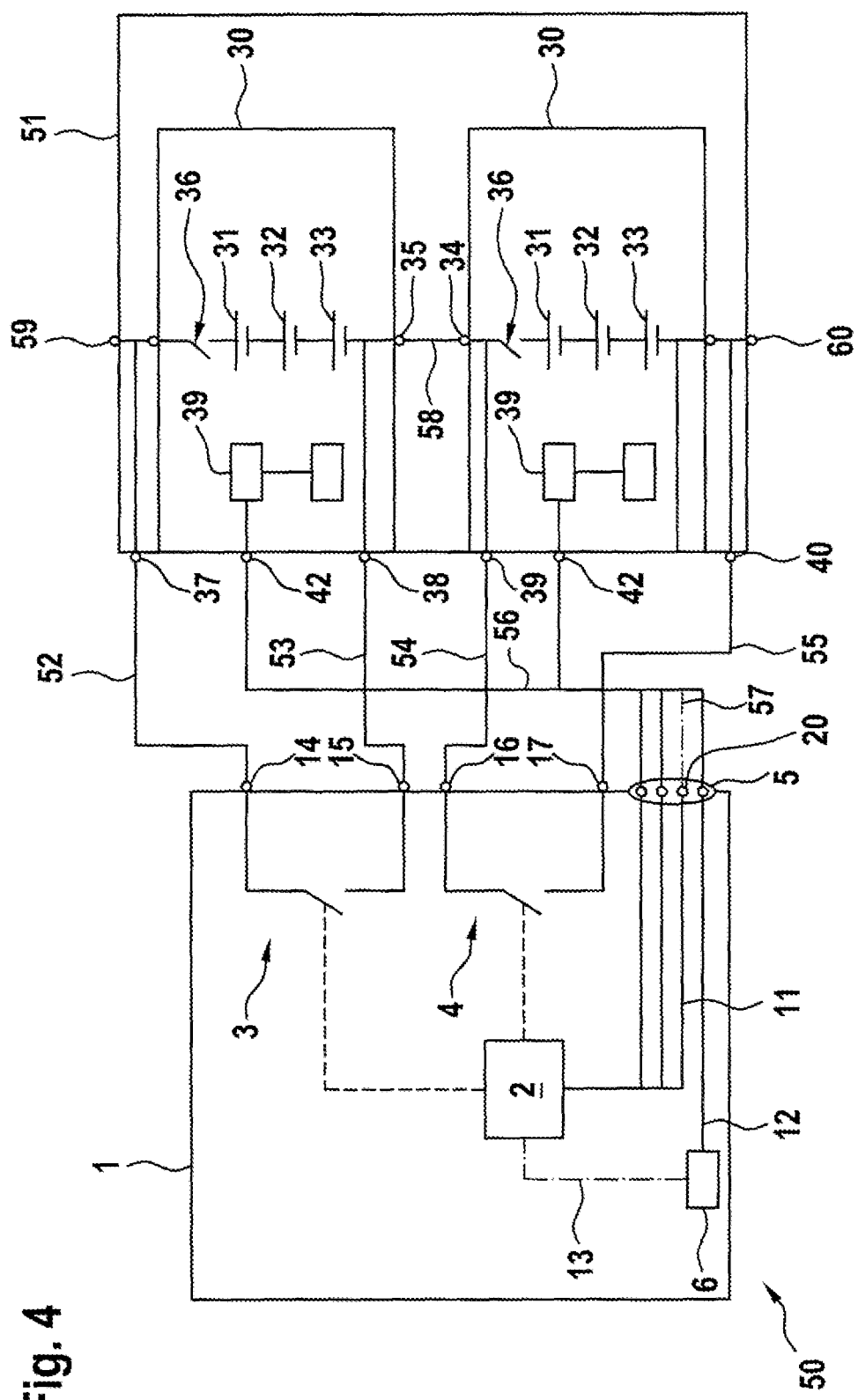
FIG. 4 shows a schematic illustration of an exemplary embodiment of a battery system according to the disclosure.

FIG. 4 shows a further exemplary embodiment, wherein the same reference symbols are used for elements which correspond to the elements of the exemplary embodiments of the previous figures in respect of function and/or design. For the sake of brevity, only the differences from the exemplary embodiments of the previous figures will be discussed.

FIG. 4 schematically shows an exemplary embodiment of a battery system 50 according to the disclosure having the battery management system 1 and having a battery 51 which has two battery modules 30. It goes without saying that the battery 51 can also have more than two battery modules 30 and each of the battery modules 30 can have more than the shown three battery cells 31, 32, 33.

The battery management system 1 corresponds to the battery management system 1 illustrated in FIG. 1 and each of the battery modules 30 of the battery 51 corresponds to the battery module 30 which is illustrated in FIG. 2. However, at least one of the battery modules 30 of the battery 51 or a further battery module 30 of the battery 51 can also be designed differently and, in particular, without the data memory 39.

The battery management system 1 is connected to the battery 51 via various lines so as to transmit current or data. In particular, the connection elements 14, 15, 16, 17 of the bridging switches 3, 4 are each connected to one of the connection elements 37, 38, 39, 40 via in each case one current line 52, 53, 54, 55 so as to conduct current. In this case, the current lines 52, 53, 54, 55 are dimensioned such that they can readily conduct the battery current which is output or received by one or by several battery modules 30. The ends of the current lines 52, 53, 54, 55 can be provided with plug couplings which can be repeatedly plug-connected to the connection elements 14, 15, 16, 17 and/or the connection elements 37, 38, 39, 40 and can be repeatedly disconnected from said connection elements. As an alternative, the connection elements 14, 15, 16, 17 can be repeatedly releasably plug-connected directly to the connection elements 37, 38, 39, 40.

The data interfaces 42 of the battery modules 30 are connected to the data interface 5 of the battery management system 1 via a data line 56 so as to transmit data. For the sake of simplicity, the data line 56 is illustrated as a line. It goes without saying that each of the data interfaces 42 can be connected and are connected to the data interface 5 via a separate data line 56. The ends of the data line 56 can also be provided with plug couplings in order to be able to be repeatedly plug-connected to and disconnected from the data interfaces 42 and the data interface 5 or to one of the connection elements 18, 19, 20, 21 of the data interface 5.

In the exemplary embodiment of FIG. 4, the sensor device 6 of the battery management system 1 is connected directly to the data interface 5 via the data line 12. As already demonstrated in the exemplary embodiment of FIG. 1, the sensor device 6 can, in addition or as an alternative, be connected to the control apparatus 2 via the data line 13, which is illustrated using a dash-dotted line, and from there, for example, to the connection element 20 of the data interface 5 via the data line 11. The connection point 20 of the data interface 5 is illustrated such that it is connected to one of the data interfaces 42 via a data line 57 which is likewise illustrated using a dash-dotted line.

A current line 58 connects the connection elements 34, 35 of the two battery modules 30 to one another so as to conduct current, with the result that a current of at least one of the battery modules 30 can flow to the other of the battery modules 30. In the exemplary embodiment of FIG. 4, the battery modules 30 are therefore connected in series with one another. As an alternative, the two battery modules 30 can also be connected in parallel with one another, and further battery modules 30 can be provided, it being possible for said further battery modules to be connected in series or in parallel with the existing battery modules 30.

The battery 51 is equipped with connection contacts 59, 60 for the connection of consumers or sources of battery energy.

Connection elements 37, 38 for connection of the battery module 30 to one of the bridging switches 3, 4 are connected in parallel with the battery modules 30. Like the connection elements 14, 15, 16, 17 of the bridging switches 3, 4, the connection elements 37, 38 can be designed as plug elements or plug contacts of a plug element such that they can be repeatedly connected to and disconnected from the connection elements 14, 15, 16, 17 and as part of the battery 51.

In the state illustrated in FIG. 4, the battery system 50 is not in operation since all of the switches 3, 4, 36 are open. If the switches 36 are now closed, a battery current can flow between the connection contacts 59, 60 of the battery 51. The battery current can be conducted, for example, to a current consumer which is to be supplied with battery energy. As an alternative, electrical energy can be supplied to the battery cells 31, 32, 33 via the contacts 59, 60 in order to charge said battery cells.

If one of the battery modules 30 is intended to be exchanged, the switch 31 has to be opened in order to interrupt the current flow to or from the battery module 30. One of the switches 3, 4 has to be closed in order to allow the current flow between the connection contacts 59, 60 to continue. The battery module 30 can be simply removed from the battery 51 and replaced with another battery module 30.

What is claimed is:

1. A battery management system for a battery having at least one battery module, the battery management system comprising:
   a first switch configured to selectively establish a current path between positive and negative terminals of a first battery module such that the first battery module is bypassed by the first switch, the first battery module having a data memory;
   a second switch configured to selectively establish a current path between positive and negative terminals of a second battery module such that the second battery module is bypassed by the second switch, the second battery module having a data memory;
   a data interface configured to couple to the data memories of the first and second battery modules; and
   a control apparatus operably connected to the first and second switch and to the data interface, the control apparatus being configured to (i) determine whether the second battery module is compatible with the first battery module based on data stored on the data memory of the second battery module, and (ii) close the second switch in response to determining that the second battery module is not compatible with the first battery module.

2. The battery management system according to claim 1, further comprising:
   a sensor device having at least one sensor which detects an operating parameter of at least one of the first and second the battery modules,
   wherein the sensor device is connected to the data interface so as to transmit data.

3. The battery management system according to claim 1, wherein the data interface and the first and second switch are configured to be repeatedly connected to and disconnected from the first and second battery module.

4. A battery system comprising:
   a battery having at least a first battery module and a second battery module, each of the first and second battery modules including (i) at least one battery cell, (ii) a non-volatile data memory in which at least one of production data of the battery module and operating data of the battery module is stored, and (iii) a first data interface; and
   a battery management system having (i) a first one switch configured to selectively establish a current path between positive and negative terminals of the first battery module such that the first one battery module is bypassed by the first switch, (ii) a second switch configured to selectively establish a current path between positive and negative terminals of the second battery module such that the second battery module is bypassed by the second switch, (iii) a second data interface configured to couple to the data memories of the first and second battery modules via the first data interfaces of the first and second battery modules, and (iv) a control apparatus operably connected to the first and second switch and to the data interface, the control apparatus being configured to determine whether the second battery module is compatible with the first battery module based on data stored on the data memory of the second battery module, and close the second switch in response to determining that the second battery module is not compatible with the first battery module.

5. The battery system according to claim 4, wherein the first and second battery modules and the battery management system are configured such that the first and second battery modules are replaceable with further battery modules.

6. A motor vehicle comprising:
a drive system; and
a battery system connected to the drive system, the battery system comprising:
a battery having at least a first battery module and a second battery module, each of the first and second battery modules including (i) at least one battery cell, (ii) a non-volatile data memory in which at least one of production data of the battery module and operating data of the battery module is stored, and (iii) a first data interface; and
a battery management system having (i) a first one switch configured to selectively establish a current path between positive and negative terminals of the first battery module such that the first one battery module is bypassed by the first switch, (ii) a second switch configured to selectively establish a current path between positive and negative terminals of the second battery module such that the second battery module is bypassed by the second switch, (iii) a second data interface configured to couple to the data memories of the first and second battery modules via the first data interfaces of the first and second battery modules, and (iv) a control apparatus operably connected to the first and second switch and to the data interface, the control apparatus being configured to determine whether the second battery module is compatible with the first battery module based on data stored on the data memory of the second battery module, and close the second switch in response to determining that the second battery module is not compatible with the first battery module.

* * * * *

UNITED STATES PATENT AND TRADEMARK OFFICE
CERTIFICATE OF CORRECTION

| | |
|---|---|
| PATENT NO. | : 9,739,836 B2 |
| APPLICATION NO. | : 13/960850 |
| DATED | : August 22, 2017 |
| INVENTOR(S) | : Hans-Joerg Wolff |

It is certified that error appears in the above-identified patent and that said Letters Patent is hereby corrected as shown below:

In the Claims

In Column 8, Lines 45-48, Lines 9-12 of Claim 4 should read:
a battery management system having (i) a first switch
    configured to selectively establish a current path
    between positive and negative terminals of the first
    battery module such that the first battery module is In Column 9, Lines 15-18, Lines 12-15 of Claim 6 should read:
a battery management system having (i) a first
    switch configured to selectively establish a current
    path between positive and negative terminals of the
    first battery module such that the first battery Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*